United States Patent
Gonano

(10) Patent No.: US 9,973,151 B2
(45) Date of Patent: May 15, 2018

(54) METHOD FOR LOAD MEASUREMENT IN SWITCHING AMPLIFIERS, CORRESPONDING DEVICE AND AMPLIFIER

(71) Applicant: STMicroelectronics S.r.l., Agrate Brianza (IT)

(72) Inventor: Giovanni Gonano, Padua (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days. days.

(21) Appl. No.: 15/389,169

(22) Filed: Dec. 22, 2016

(65) Prior Publication Data

US 2017/0346447 A1 Nov. 30, 2017

(30) Foreign Application Priority Data

May 24, 2016 (IT) .................. 102016000053313

(51) Int. Cl.
| | |
|---|---|
| *H03F 1/08* | (2006.01) |
| *H03F 3/45* | (2006.01) |
| *H03F 3/183* | (2006.01) |
| *H03F 3/217* | (2006.01) |
| *H04R 29/00* | (2006.01) |
| *G01R 31/28* | (2006.01) |

(52) U.S. Cl.
CPC ......... *H03F 1/083* (2013.01); *G01R 31/2825* (2013.01); *H03F 3/183* (2013.01); *H03F 3/2173* (2013.01); *H03F 3/45071* (2013.01); *H04R 29/001* (2013.01); *H03F 2200/03* (2013.01); *H03F 2200/462* (2013.01); *H03F 2203/45631* (2013.01)

(58) Field of Classification Search
USPC ........................ 330/251, 10, 207 A
See application file for complete search history.

(56) References Cited

U.S. PATENT DOCUMENTS

| | | | |
|---|---|---|---|
| 6,683,494 B2 * | 1/2004 | Stanley ................. | H03F 3/2175 330/10 |
| 9,660,586 B2 * | 5/2017 | Raimondi ............. | H03F 1/0205 |
| 2007/0229155 A1 | 10/2007 | Adduci et al. | |

(Continued)

FOREIGN PATENT DOCUMENTS

EP 2983292 A1 2/2016

*Primary Examiner* — Hieu Nguyen
(74) *Attorney, Agent, or Firm* — Slater Matsil, LLP

(57) ABSTRACT

A method can be used to measure a load driven by a switching amplifier having a differential input, an LC output demodulator filter and a feedback network between the amplifier output and the differential input. The amplifier is AC driven in a differential and in a common mode by applying a common. The feedback network provides feedback towards the differential input from downstream the LC demodulator filter by computing the impedance of the load as a function of the differential mode output current and the common mode output current. The feedback network provides feedback towards the differential input from upstream the LC demodulator filter by measuring the impedance value of the inductor of the LC demodulator filter, and computing the impedance of the load as a function of the differential mode output current, the common mode output current and the impedance value of the inductor of the LC demodulator filter.

20 Claims, 6 Drawing Sheets

(56) References Cited

U.S. PATENT DOCUMENTS

| | | |
|---|---|---|
| 2009/0085659 A1 | 4/2009 | Sorace et al. |
| 2009/0097667 A1 | 4/2009 | Botti et al. |
| 2009/0251216 A1 | 10/2009 | Giotta et al. |
| 2012/0194170 A1 | 8/2012 | Honda et al. |

* cited by examiner

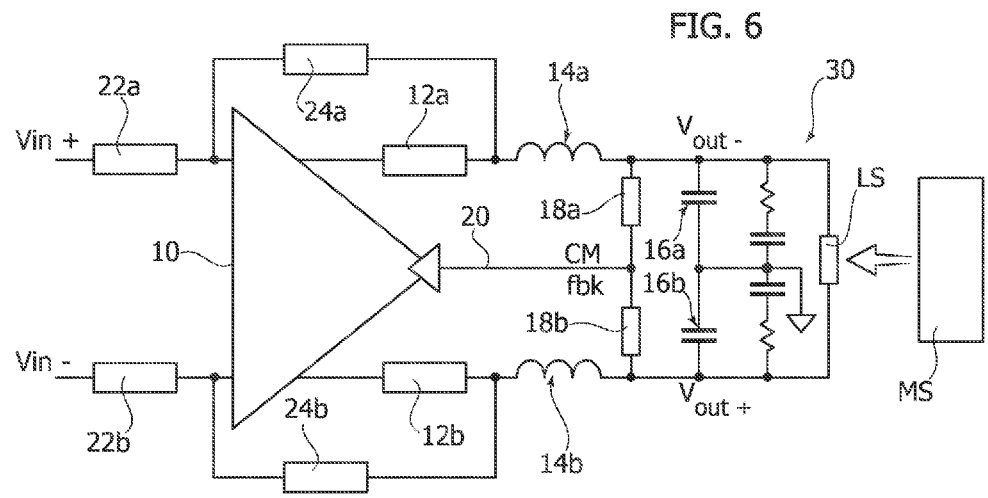
FIG. 6
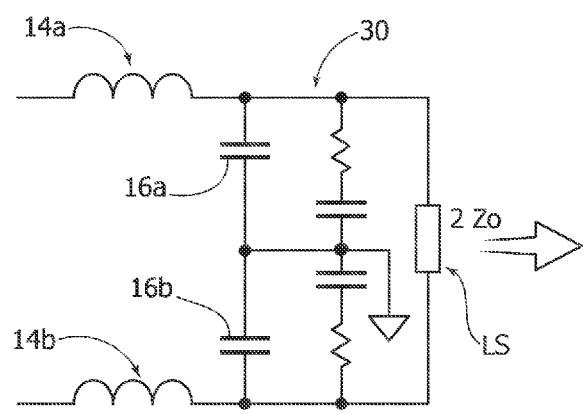
FIG. 7A
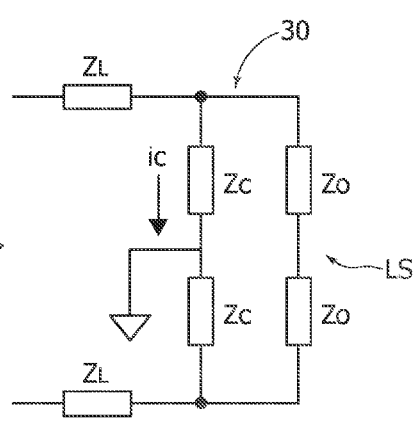
FIG. 7B
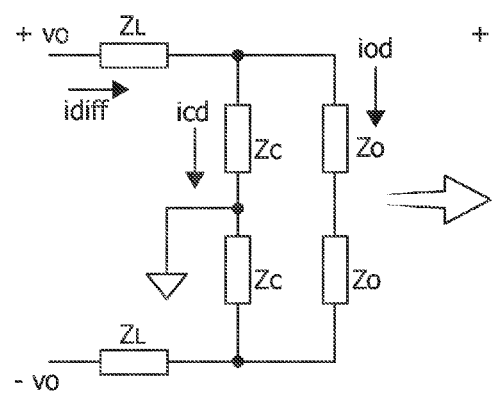
FIG. 8A
FIG. 8B

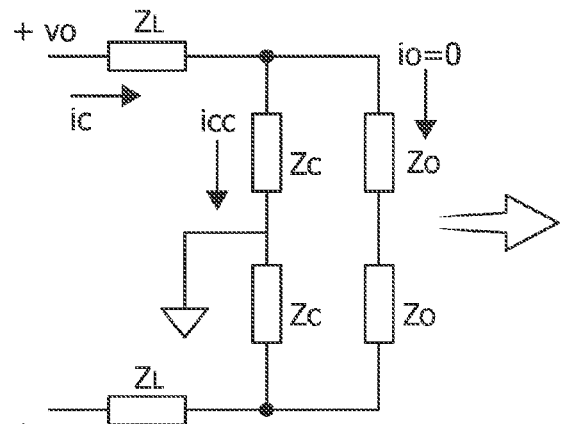
FIG. 9A
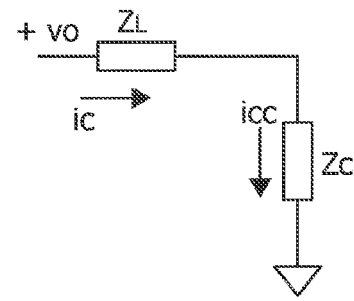
FIG. 9B
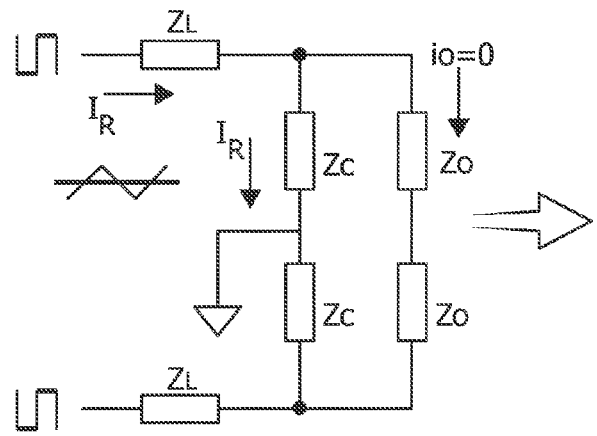
FIG. 10A
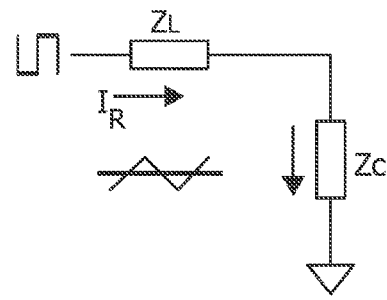
FIG. 10B
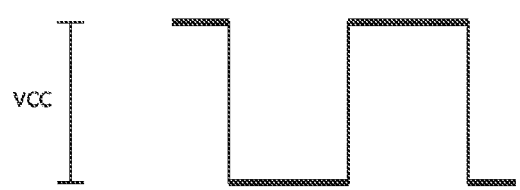
FIG. 11
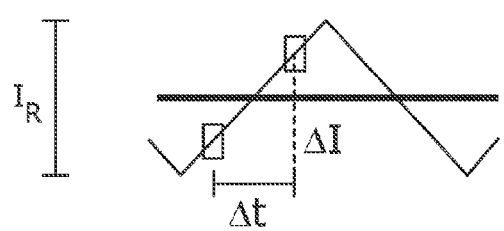

_US 9,973,151 B2_

METHOD FOR LOAD MEASUREMENT IN SWITCHING AMPLIFIERS, CORRESPONDING DEVICE AND AMPLIFIER

CROSS-REFERENCE TO RELATED APPLICATIONS

This application claims priority to Italian Application No. 102016000053313, filed on May 24, 2016, which application is hereby incorporated herein by reference.

TECHNICAL FIELD

The present invention relates generally to load measurement in amplifiers.

BACKGROUND

In various applications, the need may arise of monitoring/measuring an otherwise unknown load driven by a switching (e.g., class D) amplifier and/or by monitoring/measuring a passive LC filter and dumping network impedance without disconnecting the load.

More specifically, various application may involve performing AC current sensing in an audio (e.g., two-way) speaker system driven by a class D amplifier for diagnostic purposes, for instance.

SUMMARY

One or more embodiments may apply to high-frequency load measurement in high-frequency switching amplifiers. So-called class D audio amplifiers may be exemplary of such amplifiers.

One or more embodiments provide a solution for AC load diagnostics and passive filter network diagnostics-metering for use, e.g., in standard bridge-type class D amplifiers, e.g., without feedback after the LC demodulator filter.

One or more embodiments may relate to a corresponding system and corresponding apparatus (e.g., a switching amplifier such a class D amplifier).

One or more embodiments may offer one or more of the following advantages. Embodiments may apply even when single-ended driving is not possible and with feedback before the LC demodulation filter. Common mode driving may open new possibilities, e.g., in terms of new diagnostic features.

BRIEF DESCRIPTION OF THE DRAWINGS

One or more embodiments will be described, by way of example only, with reference to the annexed figures, wherein:

FIG. 6 is exemplary of one or more embodiments;

FIGS. 7a, 7b, 8a, 8b, 9a, 9b, 10a, 10b and 11 are exemplary of possible operation of one or more embodiments;

DETAILED DESCRIPTION OF ILLUSTRATIVE EMBODIMENTS

In the ensuing description, one or more specific details are illustrated, aimed providing an in-depth understanding of examples of embodiments of the instant description. The embodiments may be obtained by one or more of the specific details or with other methods, components, materials, and so on. In other cases, known structures, materials or operations are not illustrated or described in detail so that certain aspects of embodiment will not be obscured.

Reference to "an embodiment" or "one embodiment" in the framework of the present description is intended to indicate a particular configuration, structure, characteristic described in relation to the embodiment is compliance in at least one embodiment. Hence, phrases such as "in an embodiment" or "in one (or more) embodiments" that may be present in one or more points in the present description do not necessarily refer to one and the same embodiment. Moreover, particular conformation, structures or characteristics as exemplified in connection with any of the figures may be combined in any other quite way in one or more embodiments as possibly exemplified in other figures.

The references used herein are provided merely for convenience and hence do not define the extent of protection or the scope of the embodiments.

Figure 1:
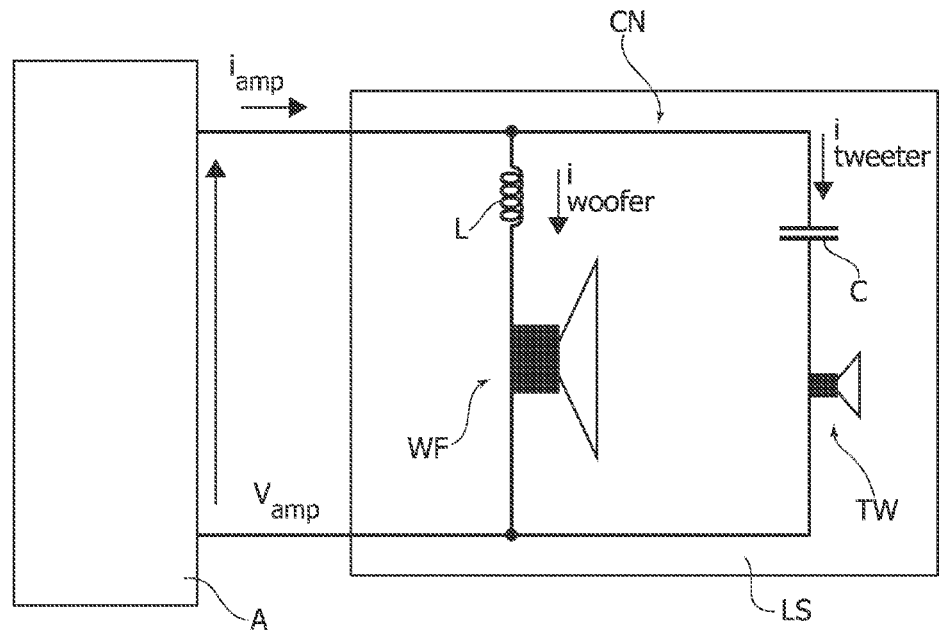
FIG. 1 is a schematic representation of an amplifier driving a load such as a 2-way speaker.

FIG. 1 is a schematic representation of an amplifier A driving a load LS.

A multi-way audio loudspeaker system may be exemplary of such a load.

In the case of a two-way system as exemplified herein, such a load may include a first loudspeaker (or "woofer") WF and a second loudspeaker (or "tweeter") TW for reproducing the low portion and the high portion of the audio frequency range (notionally 20 Hz to 20 kHz), respectively. A wide variety of technologies (electrodynamic, piezoelectric, electrostatic, ribbon, and so on) may be applied in manufacturing the loudspeakers WF and TW.

In driving the load LS the amplifier A may feed the load with an output voltage $V_{amp}$ and an output current $i_{amp}$. A so-called "crossover" network CN may partition the current $i_{amp}$ in a low-frequency component to the woofer WF and a high-frequency component to the tweeter TW, indicated $i_{woofer}$ and $i_{tweeter}$ respectively. A wide variety of crossover arrangements are known in the art. A crossover arrangement including an inductor $L_W$ and a capacitor CT coupled in series to the woofer WF and the tweeter $T_W$ is exemplified here for the sake of simplicity In various applications the need may arise of discriminating (e.g., on the basis of $V_{amp}$ and/or $i_{amp}$) between a normal tweeter condition, and an unconnected tweeter condition due to cabling being interrupted or the tweeter TW being inoperative, e.g., following the tweeter being "blown" by excessive power being fed thereto.

In various applications, performing such a task may take into account various factors. For example, in certain arrangements, the amplifier output current $i_{amp}$ may be measured (only) within the amplifier without relying on external shunt resistors. As another example, the parameters of the crossover network CN, e.g., the values for $L_W$ and $C_T$ in FIG. 1, may vary within a certain tolerance range (e.g., ±10%).

Performing such a function in a conventional (linear) amplifier may rely on the fact that the output voltage and current from the amplifier A may equal the voltage and current applied to the load LS.

In a switching (e.g., class D) amplifier things may be different insofar as the presence of an LC demodulator filter at the amplifier output leads to a situation where—even in the audio band—the load voltage and current may not correspond to the output voltage/current from the amplifier A.

In fact the values for L and C may have a certain tolerance (e.g., ±20%), which makes it hardly feasible to evaluate the load even in the presence of a precise current measurement.

For instance, even assuming that the load LS may be modeled simply as a resistor R, the following relationships may apply:

$$V_{load} = V_{amp}\{(1/[1+j\omega L/(R/2)-\omega^2 LC])\}$$

$$I_R = V_{amp}/(R/2)\{(1/[1+j\omega L/(R/2)-\omega^2 LC])\}$$

where $V_{load}$ and $V_{amp}$ denote the voltage on the load and the amplifier output voltage, respectively, $I_R$ is the current through the load (resistor R), L and C are the inductance and capacitance value representative of the LC demodulator filter at the amplifier output, and $\omega$ is the "pulsation", representative of the frequency f, with $\omega=2\pi f$.

In certain applications the values for L, C and the load impedance values may represent variables to be measured (for instance in order to equalize system frequency response).

U.S. Publication No. 2009/0097667 A1 discloses a method and circuit for testing an audio high-frequency loudspeaker which is a part of a loudspeaker system. Such a document discloses two implementations involving single-ended driving (by keeping one of the input terminals to a virtual DC level) and the use of feedback both before and after the LC demodulator filter). In the former case, the measurement result is inaccurate, even though more precise that in the case that no single-ended driving is adopted.

While effective, the arrangement disclosed in such prior art document may exhibit certain limitations in terms of the architectures to which such solution may apply.

For instance such an arrangement may be used in the case of a full bridge PWM (class D) amplifier using two distinct single-ended branches and feedback applied after the inductor filter, so that single-ended driving can be easily applied with the frequency response of the output voltage $V_{out}$ essentially load-independent.

Conversely, the solution disclosed in the document captioned in the foregoing may not be applicable in the case of a full-bridge PWM arrangement using a fully differential topology and feedback before the LC demodulator filter. In that case, single-ended driving of the output may be difficult to apply. Also, the frequency response of the output voltage $V_{out}$ may be load-dependent (not equalized).

Figure 2:
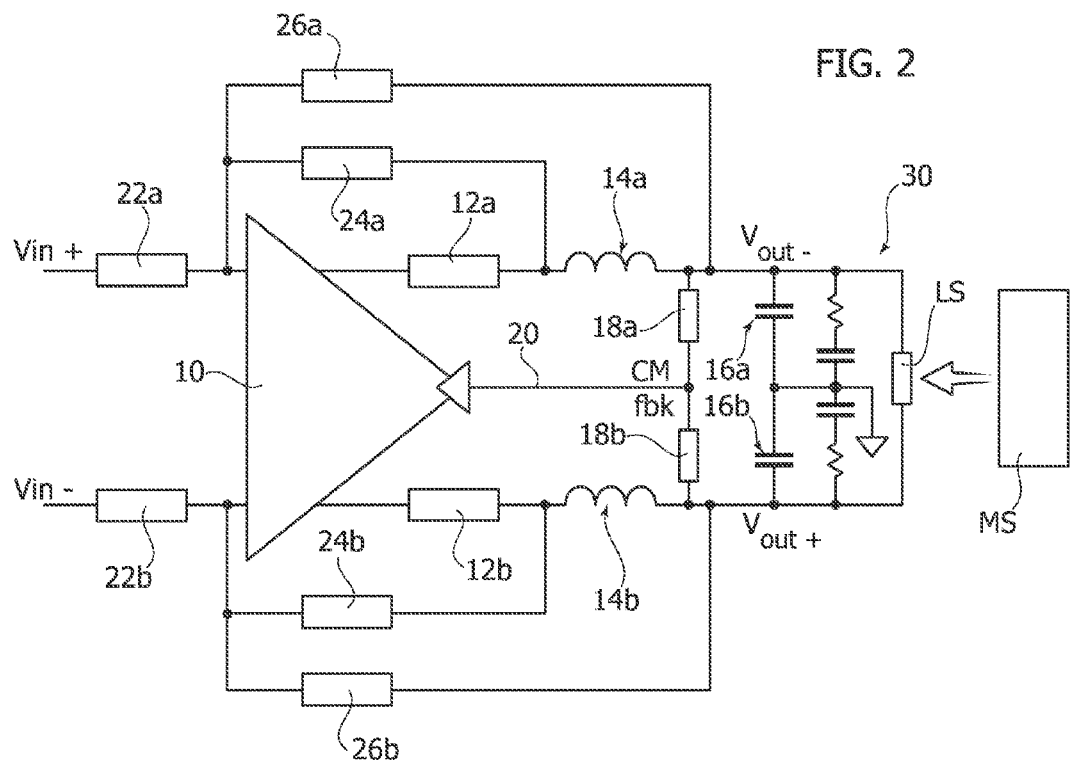
FIG. 2 is exemplary of one or more embodiments.

In the diagram of FIG. 2, reference 10 denotes a (fully differential) amplifier arrangement including a basic switching (class D) amplifier circuit coupled with PWM (Pulse Width Modulation) modulators 12a, 12b with associated LC demodulator filters 14a, 16a and 14b, 16b having a common-mode (high impedance) sensing network 18a, 18b to provide a feedback signal to the amplifier 10 over a common mode feedback line 20.

Input to such a amplifier arrangement may be applied differentially (e.g., $V_{in+}$, $V_{in-}$).

This may occur, as exemplified herein, via input resistors 22a, 22b, which may be used e.g., for systems DC-coupled with a voltage source.

In other arrangements, a high-pass voltage input may be resorted to: in that case the elements exemplified here as the resistors 22a, 22b may be an impedance including a RC network. In the case of e.g., integrated analog-to-digital converters (ADC's) the differential input may be via an array of current generators.

In one or more embodiments, impedances 24a, 24b and 26a, 26b may provide feedback towards the input of the amplifier core 10 via the impedances 24a, 24b—from the outputs of the PWM modulators 12a, 12b, that is "upstream" or before the (inductor 14a, 14b of) the LC demodulator filters, and via the impedances 26a, 26b—from the outputs voltages $V_{out-}$, $V_{out+}$ applied (differentially) across the load L, that is "downstream" or after the LC demodulator filters.

Further details on such an arrangement may be derived e.g., from US 2007/0229155 A1.

The description provided in the foregoing may also apply to the basic switching (class D) amplifier circuit illustrated in FIG. 6, save that—in the case exemplified in FIG. 6—feedback towards the input of the amplifier core 10 may be provided (only) via the impedances 24a, 24b, namely from the outputs of the PWM modulators 12a, 12b, that is "upstream" or before the LC demodulator filters.

One or more embodiments may involve the use of a measuring system MS configured to co-operate with a class D amplifier by sensing/measuring certain electrical parameters and calculating certain values as discussed in the following.

In one or more embodiments, the measuring system MS may be external to the amplifier.

In one or more embodiments the measuring system MS may be "on-board" the amplifier, that is at least partly incorporated to the amplifier.

Figure 12:
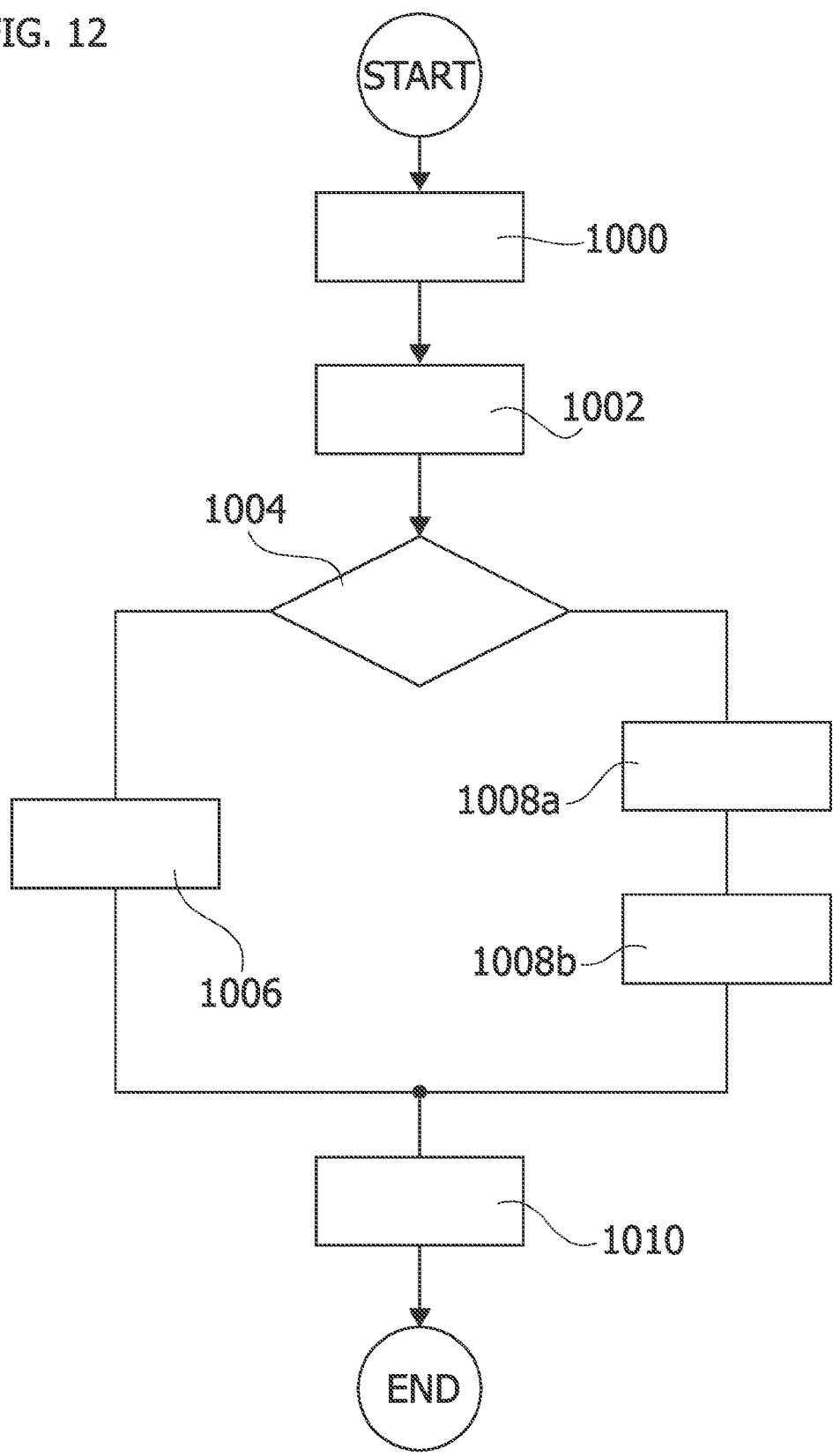
FIG. 12 is a flow chart exemplary of one or more embodiments.

In one or more embodiments, the measuring system MS may be configured for operating according to the flow-chart exemplified in FIG. 12.

A possible exemplary embodiment of such a measuring system will be discussed in the following in connection with FIG. 13.

One or more embodiments will make it possible to provide an effective AC load and LC network impedance measurement (also) for a class D amplifier system possibly having a no-single ended driving possibility: this may be the case of fully-differential system configurations wherein feedback is from upstream (namely from "before") the LC demodulator filter.

In one or more embodiments, the common-mode control circuit may be resorted to support operation as discussed in the following in connections with the exemplary flow-chart of FIG. 12.

After a START step, in a step 1000 the AC output current magnitude and phase may be sensed (e.g., by the measuring system MS—in a manner known per se) while driving the amplifier in default conditions, namely differentially via the inputs $V_{in+}$, $V_{in-}$.

In a step 1002, the AC output current magnitude and phase may be sensed while AC driving the amplifier in a common mode fashion (that is by applying a same signal to both inputs $V_{in+}$, $V_{in-}$).

If high frequency measurement/monitoring is contemplated (e.g., in the higher portion of the audio frequency range covered by a tweeter TW as exemplified in FIG. 1) AC driving may be in both cases (differential/common-mode) in the upper portion (high frequency) the audio frequency range e.g., at about 20 kHz, which may make such testing practically inaudible for the system user.

Subsequently (as exemplified by step 1004) a distinction may be made between cases where feedback after the LC filter may apply (see e.g., FIG. 2) from those cases where (standard) feedback before the LC filter may apply (see e.g., FIG. 6).

In the former case (FIG. 2) evaluation of the load current and its impedance may take place in a step 1006 already on the basis of the differential and common-mode AC driving of steps 1000 and 1002.

In the latter case (FIG. 6) the evaluation of the load current and its impedance may include a further step 1008a involving measuring the value of an inductance by a ripple current measurement, namely a higher frequency AC common mode measurement before the load impedance may be evaluated in a step 1008b.

In one or more embodiments, an evaluation of the load current and its impedance may be performed even in the most general case of feedback before the LC demodulator filter (e.g., FIG. 6).

In one or more embodiments, the impedance value of other passive filter components (e.g., a dumping network 30 coupled parallel to the capacitor 16a, 16b of the LC demodulator filter) may be obtained from the measurements.

In fact, such a dumping network 30 may include a parallel connection of a resistor and two capacitors. While the individual values of such components may not be determined, evaluating the overall impedance may by itself represent a satisfactory result.

In the following, possible operation in the case where feedback after the LC demodulation filter may apply (impedances 26a, 26b in FIG. 2) will be exemplified with reference of the sequence of steps 1000, 1002, 1004, 1006 of FIG. 12.

Then possible operation in the case where feedback before the LC demodulation filter may apply (impedances 24a, 24b in FIG. 6) will be exemplified with reference of the sequence of steps 1000, 1002, 1004, 1008a, 1008b of FIG. 12.

Figure 3A:
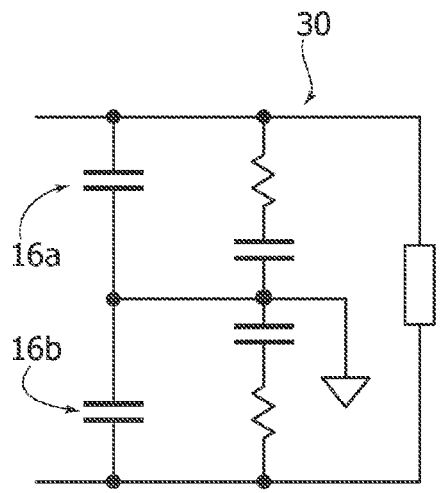
FIGS. 3a, 3b, 4a, 4b, 5a and 5b are exemplary of possible operation of one or more embodiments.
Figure 3B:
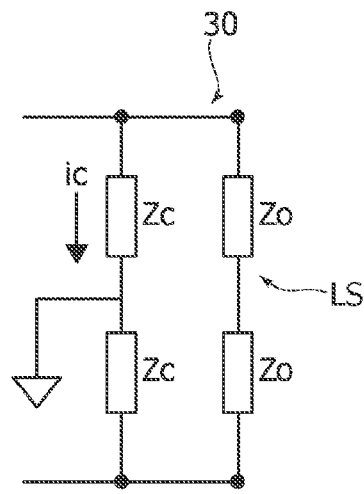

For the sake of simplicity, as exemplified in FIG. 3, the RC dumping network 30 cascaded to the LC demodulator filter 14a, 16a; 14b, 16b of the class D amplifier may be represented as a symmetrical network including two impedances $Z_c$ having an intermediate point set to ground, thus leading to an arrangement where one "half bridge" is equal to the other. Similarly, the load LS may be modeled in the form of two identical impedances $Z_o$(LS=2·$Z_o$).

Also, the (high impedance) common-mode feedback circuit 18a, 18b can be driven by an AC signal (in the place of a DC fixed signal), which is possible in the case of a fully differential architecture as exemplified in FIGS. 2 and 6. Also, one may assume that the output load voltage (differential and common mode) may be AC controlled and made known at, e.g., 20 kHz ("high frequency" within the context of the present invention, when applied to audio systems).

In these conditions, one may assume that the load LS is essentially constituted by the tweeter TW (see FIG. 1) in so far as the crossover network CN operates in such way that no appreciable current $i_{woofer}$ flows through the inductor $L_W$ and the woofer loudspeaker WF.

In one or more embodiments, proper feedback signal management (according to known principles) may render the output load voltage $v_O$ (differential and common-mode) AC controllable and known at a high frequency, thus reducing frequency response dependence on load impedance.

Figure 4A:
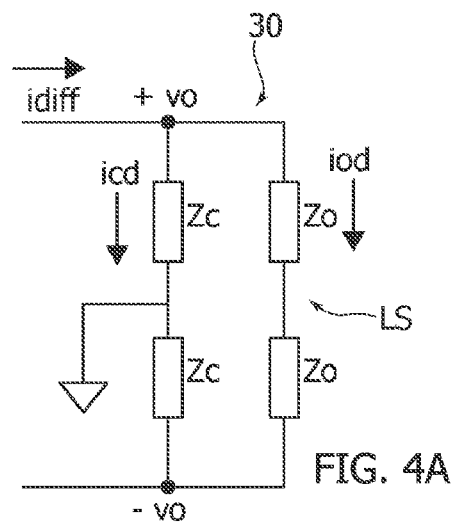
Figure 4B:
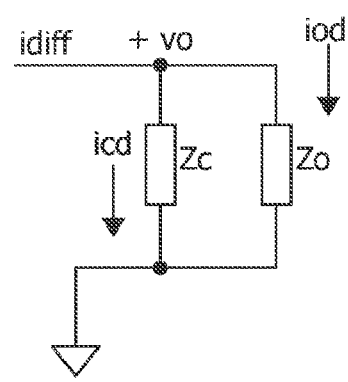
Figure 5A:
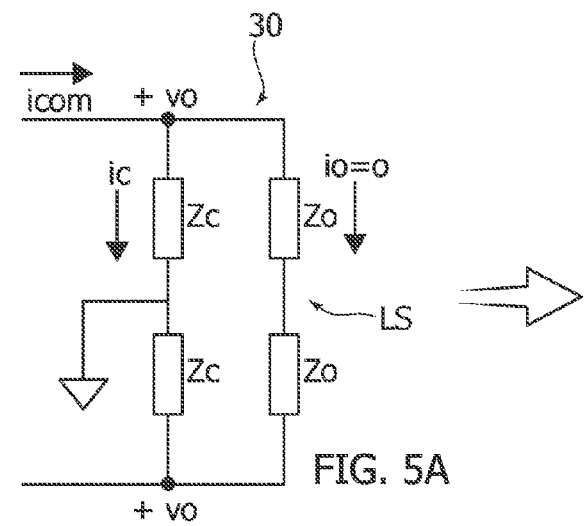
Figure 5B:
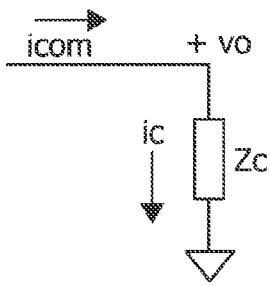

FIGS. 4 and 5 are exemplary of the arrangement of FIG. 2 being AC driven in a differential mode (FIG. 4) and in a common mode (FIG. 5), with differential driving being representative of a "default" driving mode of the amplifier between the input terminal $V_{in+}$ and $V_{in-}$.

In the case of differential AC driving (see FIG. 4), the following relationship applies:

$$i_{diff}/V_o = 1/Z_c + 1/Z_o$$

where $v_o$ is the differential output voltage (+$v_o$,−$v_o$), and $i_{diff}$ is output current sensed.

In the case of common-mode AC driving, the following relationship applies:

$$i_{comm}/v_o = 1/Z_c, \text{ that is } Z_c = v_o/i_{comm}$$

where $v_o$ is the differential output voltage (+$v_o$,−$v_o$), and $i_{comm}$ is output current sensed.

By combining the two previous relationships, as derived during AC differential and common-mode driving (steps 1000 and 1002 in FIG. 12) the following relationship may be derived:

$$Z_o = [(i_{diff} - i_{comm})/v_o]^{-1}.$$

In that way, both the load impedance $Z_o$ (specifically LS=2·$Z_o$) and the impedance $Z_c$ of the dumping network 30 may be derived and the result(s) made available in a step 1010.

While complex number notation is avoided here for the sake of simplicity, it will be appreciated that the electrical parameters discussed above are complex parameters.

Sensing/measurement by the measuring system MS (involving voltmetric and amperometric modules—of a known type—not visible in the figures) will thus involve both magnitude (modulus) and phase (angle), this being the case also for the associated calculation steps.

FIGS. 7 to 11 are exemplary of corresponding measuring steps which may be performed in the case of a circuit arrangement as exemplified in FIG. 6, that is with feedback obtained via the impedances 24a, 24b (only) before, that is upstream, of the LC demodulator filter 14a, 16a; 14b, 16b.

In such a case the frequency response of the output voltage may be load-dependent. Even in the case of FIG. 6, however, the AC voltage upstream of the LC demodulator filter may be known both in the case of differential driving and in the case of common mode driving.

As schematically represented in FIG. 7, the same symmetrical modeling of the dumping network 30 and the load LS may be adopted e.g., by modeling the dumping network and the load as two symmetric impedances $Z_c$ and $Z_o$.

Also, for the sake of the following discussion, the inductor/inductance 14a, 14b of the LC demodulator filter may be assumed to have an impedance value $Z_L = j\omega L + R_L$, including a (small) resistive component $R_L$. This resistive component may be in the range of a few tenth mOhm, and may thus be neglected or assumed to have a (very small) constant value.

Again, FIG. 8 is exemplary of differentially driving (default driving) the amplifier arrangement of FIG. 6 while sensing the output current $i_{diff}$ (both in magnitude and phase).

Under these conditions (step 1000 of FIG. 12) the following relationship will apply:

$$v_o/i_{diff} = Z_L + Z_c \| Z_o,$$

that is $$[(1/Z_c) + (1/Z_o)]^{-1} = (v_o/i_{diff}) - Z_L$$

where $Z_c \| Z_o$ denotes the parallel connection of $Z_c$ and $Z_o$.

Then (see e.g., step 1002 in FIG. 12) the amplifier arrangement of FIG. 6 may be driven in a common mode while sensing the output current $i_{comm}$. The following relationship will thus apply:

$$v_o/i_{comm}=Z_L+Z_c, \text{ that is } Z_c=V_o/i_{comm}-Z_L.$$

In the case of the arrangement of FIG. 6, the inductive value (that is, L) of the inductor 14a, 14b of the LC demodulator filter may be largely dominant at a high frequency (e.g., 20 kHz) and may be evaluated with an AC frequency measurement. In one or more embodiments this may turn out to be somehow critical in view of the PWM limited high frequency response.

In one or more embodiments, this issue—namely measuring L—may be addressed by noting that in a switching (e.g., class D) amplifier driven with in-phase modulation, the current ripple at steady state, with no input signal (duty cycle set to 50%) may admit a first order approximation as a triangular wave having an amplitude $I_R$ which is (approximately) equal to:

$$VCC/8 \cdot L \cdot f_{PWM}$$

where, as schematically shown in the upper portion of FIG. 11, VCC indicates the PWM output voltage (e.g., the output voltage of the PWM modulators 12a, 12b driven with 50% duty cycle) at a frequency $f_{PWM}$.

Under these circumstances, as schematically shown in the lower portion of FIG. 11, the inductance L may be measured by sampling the difference $\Delta I$ between the values taken of the current entering the PWM power stages at two different instants separated by a time $\Delta t$, namely:

$$L=(VCC \cdot \Delta t)/(8 \cdot \Delta I),$$

so that the value for $Z_L=j\omega L+R_L$ may be calculated (under the assumptions on $R_L$ recalled previously).

Such a measurement may be performed, e.g., in the step exemplified as 1008a in FIG. 12.

Consequently, the various measurements performed in the foregoing may be combined (e.g., in a step 1008b) as exemplified in the following, so that both $Z_c$ and $Z_o$ may be evaluated as $$Z_c=v_o/i_{comm}-Z_L \text{ and}$$

$$Z_o=\{[(v_o/i_{diff})-Z_L)]^{-1}-[(V_o/i_{comm})-Z_L)]\}^{-1}$$

In that way, both the load impedance $Z_o$ (specifically LS=$2 \cdot Z_o$) and the impedance $Z_c$ of the dumping network 30 may be derived and the result(s) may be made available in a step 1010.

While complex number notation is again avoided here for the sake of simplicity, it will once more be appreciated that the electrical parameters discussed above are complex parameters. Sensing/measurement by the measuring system MS (involving voltmetric and amperometric modules—of a known type—not visible in the figures) will thus involve both magnitude (modulus) and phase (angle), this being the case also for the associated calculation steps.

Figure 13:
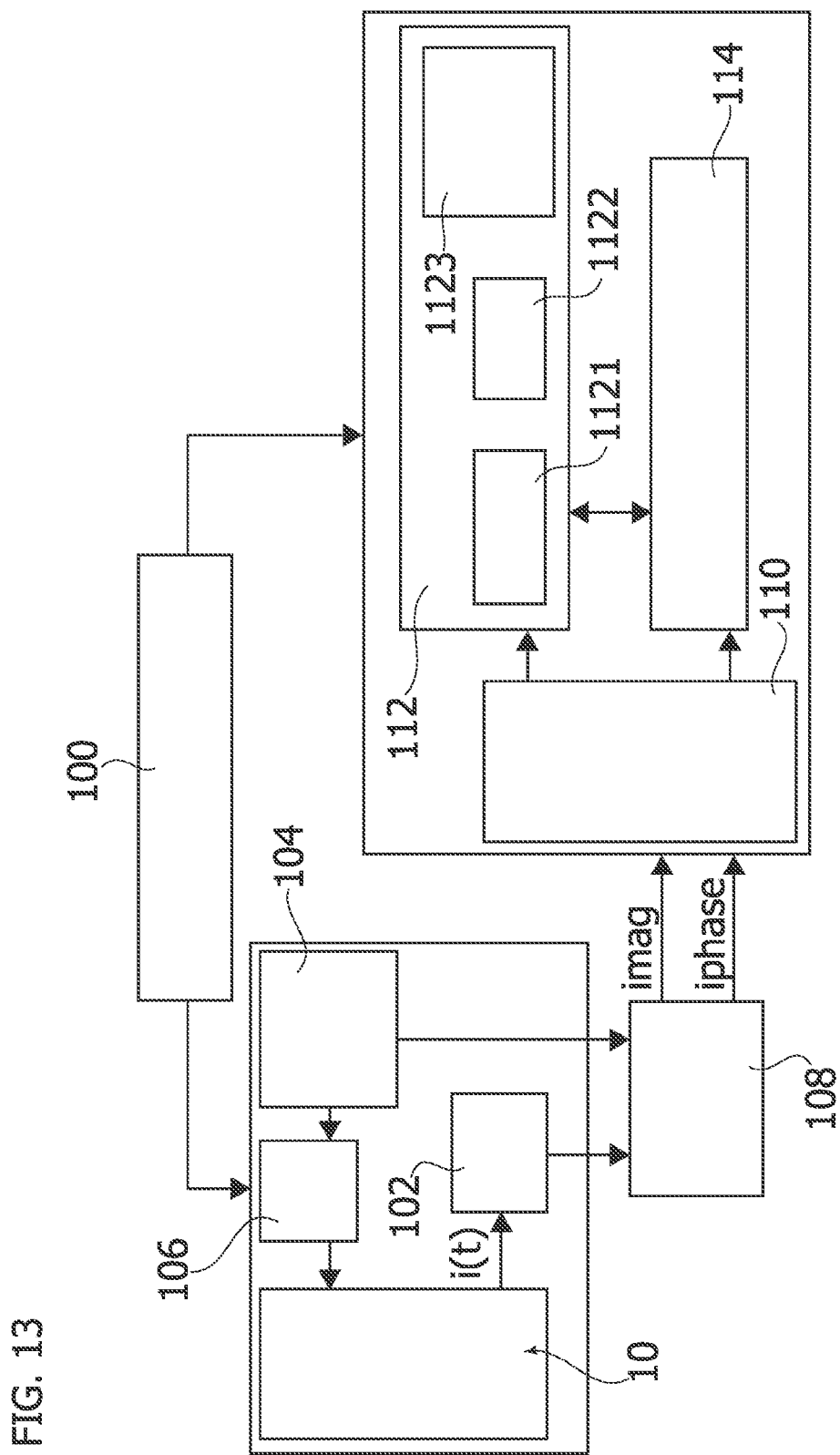
FIG. 13 is an exemplary block diagram of embodiments of a measuring system.

In more embodiments, a measuring system MS as exemplified e.g., in FIGS. 2 and 6 may be implemented according to the general layout exemplified by the block diagram of FIG. 13, where the following block designations apply:
- 10—Class D amplifier core (see also FIGS. 2 and 6)
- 100—State machine (main blocks handling)
- 102—analog-to-digital converter (ADC) of the current i(t) from the amplifier
- 104—sinusoid (sine-wave) generator
- 106—digital-to-analog converter (DAC) of the sine-wave to the amplifier 10
- 108—magnitude ($i_{mag}$) and phase ($i_{phase}$) evaluation block
- 110—state machine for impedance evaluation based on $i_{mag}$ and $i_{phase}$
- 112—arithmetic unit (including e.g., a multiplier X*Y, an inverse calculation module 1/X and a magnitude-phase <->real(Re)-imaginary(Im) conversion module).
- 114—memory In one or meme embodiments, various options may be adopted for signal sensing/detection.

For instance, since a switching (class D) amplifier is involved one may rely on the "on" resistance RdsON of the power stage: the voltage Vds may be ADC converted when the power stage is on, so that Vds≅RdsON*Iload, by neglecting minor secondary effects.

Another option may be direct measurement of Iout by Hall effect in the silicon.

Sensing external to the amplifier may rely on the series resistance of the inductor by accessing the voltage before and after the filter.

Arranging a sensing resistor Rsens in series to the load LS may reduce load swing and increase power dissipation, the same applying also to other current probes measuring the current on the load, which would result in a more complex system (including external components and/or additional pins in the IC).

In a possible (real world) arrangement, the following values may be assumed:
- inductors 14a, 14b of the LC demodulator filter: L=10 pH±10%
- capacitors 16a, 16b of the LC demodulator filter: C=3.3 µF±10%
- resistor of the dumping network 30: $R_d$=10 Ohm
- capacitor of the dumping network 30: $C_d$=1 µF
- nominal (normal) load=4 ohm
- open load=4 Ohm+600 µH=75 Ohm 87 deg, when measurement is performed at 20 kHz.

In a standard method, where only current magnitude is measured, values for the load current may be, e.g., i=0.88 A±2% and i=0.96 A±30%, in normal load condition and open load condition, respectively.

The tolerances indicated may only consider a component maximum variation without considering measurement error. It will be appreciated that, under such conditions, open load may not be detectable and might be done only to LC filter tolerance. For instance, at e.g., 20 kHz with connected load, L and C at nominal value (no error), a current measured may be e.g., 0.88 A. A same measured value may be obtained with a disconnected tweeter and a lower filter capacitance C: when the tweeter is disconnected, the load measurement may be largely influenced by the values of L and C which may vary extensively forma production item to another.

By using the solution of one or more embodiments, under the conditions outlined, and by assuming an even more critical situation (that is by assuming measurements of i and v affected by a 10% tolerance/error) a normal load having a module |Z|=4 Ohm±$_{15}$% and a phase=0±9 degrees may be detected.

Similarly, in an open load condition, a module |Z|=75 Ohm±16% and a phase=87±2 degrees may be detected by assuming as a tolerance 10% error on current and inductance (this being likely to represent a worst case correlation).

Both typical values for L and C may be considered in a measurement which is not dependent on L and C tolerances as these are included in the quantities measured: that is, no a priori knowledge of L and C is needed since these may be measured in one or more embodiments. Open load conditions may thus be detected while also providing impedance evaluation.

As indicated, in one or more embodiments, the measurement system MS may be incorporated to the amplifier circuitry, with the whole system adapted to be switched to "diagnostic" mode. In response to being switched to such diagnostic mode, the amplifier will be configured in order to operate, in addition to an otherwise standard AC differential mode (default mode—step 1000 in FIG. 12) to an AC common mode in order to perform the step indicated as 1002 in FIG. 12.

Without prejudice to the underlying principles, the details and the embodiments may vary, even significant, with respect to what has been disclosed by way of example only in the foregoing, without departing from the extent of protection.

The extent of protection is defined by the annexed claims.

What is claimed is:

1. A method of measuring a load driven by a switching amplifier, the amplifier having an amplifier output, a differential input, an LC demodulator filter and a feedback network between the amplifier output and the differential input, wherein the amplifier includes an output dumping network downstream of the LC demodulator filter, the method comprising:
    AC driving the amplifier in a differential mode by applying a differential AC signal to the differential input and sensing an AC output current while driving the amplifier in the differential mode;
    AC driving the amplifier in a common mode by applying a common mode AC signal to the differential input and sensing the AC output current while driving the amplifier in the common mode;
    wherein the feedback network provides feedback towards the differential input from downstream the LC demodulator filter by computing an impedance of the load as a function of a differential mode output current and a common mode output current;
    wherein the feedback network provides feedback towards the differential input from upstream the LC demodulator filter by measuring an impedance value of an inductor of the LC demodulator filter, and computing the impedance of the load as a function of the differential mode output current, the common mode output current and the impedance value of the inductor of the LC demodulator filter; and
    wherein the feedback network provides feedback towards the differential input from downstream the LC demodulator filter by computing the impedance of the output dumping network as a function of the common mode output current.

2. The method of claim 1, wherein, with the feedback network providing feedback towards the differential input from downstream the LC demodulator filter, the method comprises computing the impedance of the load as a function of the difference between the differential mode output current and the common mode output current.

3. The method of claim 2, wherein the function comprises:

$$Zo = [(i\text{diff} - i\text{comm})/vo]^{-1}$$

wherein Zo is the impedance of the load, idiff and icomm are the differential mode output current and the common mode output current, respectively, and vo is an output voltage from the amplifier.

4. The method of claim 1, wherein, with the feedback network providing feedback towards the differential input from upstream the LC demodulator filter, the method comprises computing the impedance of the load as a function of the difference of the ratio of an output voltage from the amplifier to the differential mode output current, and the difference of the ratio of the output voltage from the amplifier to the common mode output current.

5. The method of claim 4, wherein the function comprises:

$$Zo = \{[(vo/i\text{diff}) - ZL)] - 1 - [(vo/i\text{comm}) - ZL)]\}^{-1}$$

wherein Zo is the impedance of the load, idiff and icomm are the differential mode output current and the common mode output current, respectively, vo is the output voltage from the amplifier, and ZL is the impedance value of the inductor of the LC demodulator filter.

6. The method of claim 1, wherein impedance of the output dumping network is computed using the function $$Zc = vo/i\text{comm}$$

wherein Zc is the impedance of the output dumping network, icomm is the common mode output current, and vo is an output voltage from the amplifier.

7. The method of claim 1, further comprising measuring the impedance value of the inductor of the LC demodulator filter by:
    in phase driving the differential input to produce a 50% duty cycle PWM output voltage and a triangular wave output current from the amplifier; and
    measuring the impedance value of the inductor of the LC demodulator filter as a function of an inductor current at two different instants.

8. The method of claim 1, comprising AC driving the amplifier, both in the differential mode and in the common mode, in the audio frequency range.

9. The method of claim 8, comprising AC driving the amplifier, both in the differential mode and in the common mode, in an upper portion of the audio frequency range.

10. The method of claim 9, comprising AC driving the amplifier, both in the differential mode and in the common mode at about 20 kHz.

11. The method of claim 7, wherein measuring the impedance value of the inductor of the LC demodulator filter is computed using the function:

$$L = (VCC \cdot \Delta t)/(8 \cdot \Delta I)$$

wherein $\Delta t$ is the difference in time between the two instances and $\Delta I$ is the difference between inductor currents at the two instances.

12. A method of measuring a load driven by a switching amplifier, the amplifier having an amplifier output, a differential input, an LC demodulator filter and a feedback network between the amplifier output and the differential input, wherein the amplifier includes an output dumping network downstream of the LC demodulator filter, the method comprising:
    AC driving the amplifier in a differential mode by applying a differential AC signal to the differential input and sensing an AC output current while driving the amplifier in the differential mode;
    AC driving the amplifier in a common mode by applying a common mode AC signal to the differential input and sensing the AC output current while driving the amplifier in the common mode;
    wherein the feedback network provides feedback towards the differential input from downstream the LC demodulator filter by computing an impedance of the load as a function of a differential mode output current and a common mode output current;
    wherein the feedback network provides feedback towards the differential input from upstream the LC demodulator filter by measuring an impedance value of an inductor of the LC demodulator filter, and computing the impedance of the load as a function of the differential mode output current, the common mode output current and the impedance value of the inductor of the LC demodulator filter; and wherein the feedback network provides feedback towards the differential input from upstream the LC demodulator filter by computing the impedance of the output dumping network as a function of the common mode output current and the impedance value of the inductor of the LC demodulator filter.

13. The method of claim 12, wherein impedance of the output dumping network is computed using the function:

$$Zc=vo/icomm-ZL$$

wherein Zc is the impedance of the output dumping network, ZL is the impedance value of the inductor of the LC demodulator filter, icomm is the common mode output current, and vo is an output voltage from the amplifier.

14. A device for measuring a load driven by a switching amplifier, the amplifier having an amplifier output, a differential input, an LC demodulator filter and a feedback network between the amplifier output and the differential input, wherein the amplifier comprises an output dumping network downstream of the LC demodulator filter, the device comprising:
means for AC driving the amplifier in a differential mode by applying a differential AC signal to the differential input and sensing an AC output current from the amplifier while driving the amplifier in the differential mode;
means for AC driving the amplifier in a common mode by applying a common mode AC signal to the differential input and sensing the AC output current from the amplifier while driving the amplifier in the common mode; and
means for computing an impedance of the load by having the feedback network provide feedback towards the differential input from downstream the LC demodulator filter by computing the impedance of the load as a function of a differential mode output current and a common mode output current and by having the feedback network provide feedback towards the differential input from upstream the LC demodulator filter by measuring an impedance value of an inductor of the LC demodulator filter, computing the impedance of the output dumping network as a function of the common mode output current and the impedance value of the inductor of the LC demodulator filter, and computing the impedance of the load as a function of the differential mode output current, the common mode output current and the impedance value of the inductor of the LC demodulator filter.

15. A circuit comprising:
a switching amplifier having a differential input, an LC demodulator filter and a feedback network between an amplifier output and the differential input; and
a measurement circuit coupled to the switching amplifier coupled, the measurement circuit configured to AC drive the amplifier in a differential mode by applying a differential AC signal to the differential input and sensing an AC output current from the amplifier while driving the amplifier in the differential mode, and to AC drive the amplifier in a common mode by applying a common mode AC signal to the differential input and sensing the AC output current from the amplifier while driving the amplifier in the common mode;

wherein the feedback network is configured to provide feedback towards the differential input from downstream the LC demodulator filter by computing an impedance of a load as a function of a differential mode output current and a common mode output current;
wherein the feedback network is configured to provide feedback towards the differential input from upstream the LC demodulator filter by measuring an impedance value of a inductor of the LC demodulator filter, and to compute the impedance of the load as a function of the differential mode output current, the common mode output current and the impedance value of the inductor of the LC demodulator filter, wherein the amplifier includes an output dumping network downstream of the LC demodulator filter;
wherein the feedback network is configured to provide feedback towards the differential input from upstream the LC demodulator filter by computing the impedance of the output dumping network as a function of the common mode output current and the impedance value of the inductor of the LC demodulator filter; and
wherein impedance of the output dumping network is computed using the function:

$$Zc=vo/icomm-ZL$$

wherein Zc is the impedance of the output dumping network, ZL is the impedance value of the inductor of the LC demodulator filter, icomm is the common mode output current, and vo is an output voltage from the amplifier.

16. The switching amplifier of claim 15, wherein the measurement circuit is incorporated with the switching amplifier.

17. The switching amplifier of claim 15, wherein the amplifier includes an audio amplifier.

18. The switching amplifier of claim 17, wherein the amplifier is a Class D amplifier.

19. A circuit comprising:
a switching amplifier having a differential input, an LC demodulator filter and a feedback network between an amplifier output and the differential input, wherein the amplifier includes an output dumping network downstream of the LC demodulator filter; and
a measurement circuit coupled to the switching amplifier coupled, the measurement circuit configured to AC drive the amplifier in a differential mode by applying a differential AC signal to the differential input and sensing an AC output current from the amplifier while driving the amplifier in the differential mode, and to AC drive the amplifier in a common mode by applying a common mode AC signal to the differential input and sensing the AC output current from the amplifier while driving the amplifier in the common mode;
wherein the feedback network is configured to provide feedback towards the differential input from downstream the LC demodulator filter by computing an impedance of a load as a function of a differential mode output current and a common mode output current;
wherein the feedback network is configured to provide feedback towards the differential input from upstream the LC demodulator filter by measuring an impedance value of a inductor of the LC demodulator filter, and to compute the impedance of the load as a function of the differential mode output current, the common mode output current and the impedance value of the inductor of the LC demodulator filter;
wherein the feedback network is configured to provide feedback towards the differential input from downstream the LC demodulator filter by computing the impedance of the output dumping network as a function of the common mode output current; and wherein the impedance of the output dumping network is computed using the function $Zc = vo/icomm$ wherein Zc is the impedance of the output dumping network, icomm is the common mode output current, and vo is an output voltage from the amplifier.

20. The switching amplifier of claim 15, wherein the load comprises a woofer and a tweeter.

* * * * *